(12) United States Patent
Uchida et al.

(10) Patent No.: US 7,951,868 B2
(45) Date of Patent: May 31, 2011

(54) CARBOXYL GROUP-CONTAINING POLYURETHANE AND USES THEREOF

(75) Inventors: Hiroshi Uchida, Kawasaki (JP); Ritsuko Azuma, Kawasaki (JP)

(73) Assignee: Showa Denko K.K., Tokyo (JP)

( * ) Notice: Subject to any disclaimer, the term of this patent is extended or adjusted under 35 U.S.C. 154(b) by 574 days.

(21) Appl. No.: 11/994,442

(22) PCT Filed: Jul. 4, 2006

(86) PCT No.: PCT/JP2006/313643
§ 371 (c)(1),
(2), (4) Date: Jan. 2, 2008

(87) PCT Pub. No.: WO2007/004738
PCT Pub. Date: Jan. 11, 2007

(65) Prior Publication Data
US 2009/0118422 A1    May 7, 2009

Related U.S. Application Data

(60) Provisional application No. 60/697,970, filed on Jul. 12, 2005.

(30) Foreign Application Priority Data

Jul. 4, 2005    (JP) .................. 2005-194821

(51) Int. Cl.
| | |
|---|---|
| C08G 18/00 | (2006.01) |
| C08G 18/08 | (2006.01) |
| C08G 18/10 | (2006.01) |
| C08G 18/28 | (2006.01) |
| C08G 18/70 | (2006.01) |
| C08G 59/50 | (2006.01) |
| C08J 3/00 | (2006.01) |
| C08K 3/20 | (2006.01) |
| C08L 75/00 | (2006.01) |
| C09D 11/00 | (2006.01) |

(52) U.S. Cl. ........ 524/590; 523/160; 523/161; 523/400; 524/507; 524/589; 524/591; 524/839; 524/840; 528/44; 528/59; 528/65; 528/67; 528/85

(58) Field of Classification Search .................. 524/507, 524/589, 590, 591, 839, 840; 528/44, 59, 528/65, 67, 85; 523/160, 161, 400
See application file for complete search history.

(56) References Cited

U.S. PATENT DOCUMENTS

| | | |
|---|---|---|
| 5,143,997 A | 9/1992 | Endo et al. |
| 5,177,141 A * | 1/1993 | Thoma et al. .................. 524/591 |

FOREIGN PATENT DOCUMENTS

| | | |
|---|---|---|
| JP | 63-182337 A | 7/1988 |
| JP | 4-93316 A | 3/1992 |
| JP | 2004-137370 A | 5/2004 |
| JP | 2004-182792 A | 7/2004 |
| JP | 2004-220020 A | 8/2004 |
| JP | 2005-41990 A | 2/2005 |

* cited by examiner

*Primary Examiner* — Patrick D Niland
(74) *Attorney, Agent, or Firm* — Sughrue Mion, PLLC

(57) ABSTRACT

Disclosed is a carboxyl group-containing polyurethane containing a structure derived from a polycarbonate diol (B), the polycarbonate diol (B) having: (i) a number-average molecular weight of 500 to 50,000; (ii) an alkylene group of 8 to 18 carbon atoms in its structure; and (iii) hydroxyl groups at both ends. The carboxyl group-containing polyurethane is suitable as materials of cured products that are excellent in adhesion with substrates, low warpage, flexibility, plating resistance, soldering heat resistance and long-term reliability.

14 Claims, No Drawings

CARBOXYL GROUP-CONTAINING POLYURETHANE AND USES THEREOF

CROSS-REFERENCE TO RELATED APPLICATIONS

This application is an application filed under 35 U.S.C. §111(a) claiming benefit pursuant to 35 U.S.C. §119(e) (1) of the filing dates of Provisional Application 60/697,970 filed Jul. 12, 2005 pursuant to 35 U.S.C. §111(b).

TECHNICAL FIELD

The present invention relates to a carboxyl group-containing polyurethane. More particularly, the invention is concerned with a carboxyl group-containing polyurethane capable of giving cured products excellent in adhesion with substrates, low warpage, flexibility, plating resistance, soldering heat resistance and long-term reliability.

BACKGROUND ART

Surface protective films of flexible printed circuits are for example adhesive-bonded polyimide films, called coverlay films, that are punched out with a die conforming to the pattern, and are screen-printed films of UV or heat curable overcoating agents having flexibility, with the latter being more advantageous particularly in workability. Known such curable overcoating resins include resin compositions based on epoxy resins, acrylic resins or mixtures thereof. These compositions are often based on resins modified by introduction of butadiene, siloxane, polycarbonate diol or long chain aliphatic structures, whereby the flexibility is improved and the warpage due to cure shrinkage or heat shrinkage is prevented while minimizing the reduction of heat resistance, chemical resistance and electrical insulating properties inherent to the surface protective films.

With recent weight reduction and miniaturization of electronic equipment, flexible substrates are reduced in weight and thickness and are therefore more significantly susceptible to the flexibility and cure shrinkage of the overcoating resin compositions. Consequently, the curable overcoating resins do not satisfy performance requirements in terms of flexibility and warpage due to cure shrinkage.

JP-A-2004-137370 (Patent Document 1) discloses a polyamideimide resin produced through reaction of a polycarbonate diol from a diol having 6 or less carbon atoms, with a diisocyanate compound to prepare a polyurethane having two isocyanate groups at both ends, and reaction of the diisocyanate-terminated polyurethane with trimellitic acid. Cured products of the resin have unsatisfactory long-term reliability in electrical characteristics.

JP-A-2004-182792 (Patent Document 2) discloses a polyamideimide resin with an organosiloxane structure. Cured products of the resin have bad adhesion to substrates. This prior art uses special solvents such as N-methyl-2-pyrrolidone, which can dissolve emulsifying agents in the screen-printing, often resulting in problems.

Patent Document 1: JP-A-2004-137370
Patent Document 2: JP-A-2004-182792

DISCLOSURE OF THE INVENTION

The present invention is directed to solving the problems in the background art. It is therefore an object of the invention to provide a carboxyl group-containing polyurethane capable of giving cured products excellent in adhesion with substrates, low warpage, flexibility, plating resistance, soldering heat resistance and long-term reliability. It is another object of the invention to provide the solution of carboxyl group-containing polyurethane including the carboxyl group-containing polyurethane, and a solder resist ink including the solution.

It is a further object of the invention to provide a cured product excellent in adhesion with substrates, low warpage, flexibility, plating resistance, soldering heat resistance and long-term reliability.

The present inventors studied diligently to solve the above problems, and they have arrived at a solder resist ink that includes a carboxyl group-containing polyurethane which has a structure derived from a specific polycarbonate diol obtained from a diol having 8 to 18 carbon atoms, or includes a carboxyl group-containing polyurethane resulting from reaction of at least the polyol, a polyisocyanate compound and a carboxyl group-containing hydroxy compound. The solder resist ink has been found to give cured products excellent in adhesion with substrates, flexibility, plating resistance, soldering heat resistance and long-term insulating properties at high temperatures and high humidities. The present invention has been completed based on the findings. The present invention is concerned with the following [1] to [19].

[1] A carboxyl group-containing polyurethane comprising a structure derived from a polycarbonate diol (B), the polycarbonate diol (B) having:
  (i) a number-average molecular weight of 500 to 50,000;
  (ii) an alkylene group of 8 to 18 carbon atoms in its structure; and
  (iii) hydroxyl groups at both ends.

[2] The carboxyl group-containing polyurethane as described in [1] produced by reacting:
  (A) a polyisocyanate compound;
  (B) a polycarbonate diol having:
    (i) a number-average molecular weight of 500 to 50,000;
    (ii) an alkylene group of 8 to 18 carbon atoms in its structure; and
    (iii) hydroxyl groups at both ends;
  (C) a carboxyl group-containing dihydroxy compound;
  (D) an optional monohydroxy compound; and
  (E) an optional monoisocyanate compound.

[3] The carboxyl group-containing polyurethane as described in [2], wherein the polyisocyanate compound (A) contains at least 10 mol % relative to the total (100 mol %) thereof of an aromatic and/or an alicyclic compound of 6 to 30 carbon atoms except the carbon atom in the isocyanate group (NCO group).

[4] The carboxyl group-containing polyurethane as described in [2] or [3], wherein the polyisocyanate compound (A) is one or a combination of two or more polyisocyanate compounds selected from the group consisting of 1,4-cyclohexane diisocyanate, isophorone diisocyanate, methylenebis (4-cyclohexyl isocyanate), hydrogenated 1,3-xylylene diisocyanate, hydrogenated 1,4-xylylene diisocyanate, 2,4-tolylene diisocyanate, 2,6-tolylene diisocyanate and diphenylmethane-4,4'-diisocyanate.

[5] The carboxyl group-containing polyurethane as described in any one of [1] to [4], wherein the polycarbonate diol (B) is produced from a raw material diol including at least 30 mol % of a diol having 8 to 18 carbon atoms.

[6] The carboxyl group-containing polyurethane as described in any one of [1] to [5], wherein at least part of the alkylene groups constituting the structure of the polycarbonate diol (B) is an alkylene group of 9 carbon atoms.

[7] The carboxyl group-containing polyurethane as described in [6], wherein the alkylene group of 9 carbon atoms is represented by —CH$_2$—CH(CH$_3$)—(CH$_2$)$_6$— and/or —(CH$_2$)$_9$—.

[8] The carboxyl group-containing polyurethane as described in any one of [2] to [7], wherein the dihydroxy compound (C) is 2,2-dimethylolpropionic acid and/or 2,2-dimethylolbutanoic acid.

[9] The carboxyl group-containing polyurethane as described in any one of [2] to [8], wherein the monohydroxy compound (D) is one or a combination of two or more monohydroxy compounds selected from the group consisting of 2-hydroxyethyl acrylate, 2-hydroxyethyl methacrylate, allyl alcohol, glycolic acid and hydroxypivalic acid.

[10] The carboxyl group-containing polyurethane as described in any one of [2] to [8], wherein the monohydroxy compound (D) is one or a combination of two or more monohydroxy compounds selected from the group consisting of methanol, ethanol, n-propanol, isopropanol, n-butanol, isobutanol, sec-butanol and t-butanol.

[11] The carboxyl group-containing polyurethane as described in any one of [1] to [10], wherein the polyurethane has a number-average molecular weight of 1,000 to 100,000 and an acid value of 5 to 120 mgKOH/g.

[12] The carboxyl group-containing polyurethane as described in any one of [1] to [11], wherein the polyurethane has a number-average molecular weight of 3,000 to 50,000 and an acid value of 10 to 70 mgKOH/g.

[13] A solution of carboxyl group-containing polyurethane comprising:
the carboxyl group-containing polyurethane of any one of [1] to [12]; and
a solvent that is free of basic compounds and has a boiling point of not less than 120° C.

[14] The solution of carboxyl group-containing polyurethane as described in [13], wherein the solvent is one or a combination of two or more solvents selected from the group consisting of toluene, xylene, ethylbenzene, nitrobenzene, isophorone, diethylene glycol dimethyl ether, ethylene glycol diethyl ether, ethylene glycol methyl ether acetate, ethylene glycol ethyl ether acetate, propylene glycol methyl ether acetate, propylene glycol ethyl ether acetate, dipropylene glycol methyl ether acetate, dipropylene glycol ethyl ether acetate, diethylene glycol ethyl ether acetate, diethylene glycol methyl ether acetate, methyl methoxypropionate, ethyl methoxypropionate, methyl ethoxypropionate, ethyl ethoxypropionate, n-butyl acetate, isoamyl acetate, ethyl lactate, cyclohexanone, γ-butyrolactone and dimethylsulfoxide.

[15] The solution of carboxyl group-containing polyurethane as described in [13] or [14], wherein the solid concentration is in the range of 30 to 80 wt %.

[16] A solder resist ink comprising the solution of carboxyl group-containing polyurethane of any one of [13] to [15].

[17] An overcoat ink comprising the solution of carboxyl group-containing polyurethane of any one of [13] to [15].

[18] A cured product produced by curing the solder resist ink of [16] or the overcoat ink of [17].

[19] The cured product as described in [18], wherein the curing involves an epoxy resin.

The carboxyl group-containing polyurethane, the solution of carboxyl group-containing polyurethane, and the solder resist ink including the solution are suitable as materials of cured products, for example cured films, that are excellent in adhesion with substrates, low warpage, flexibility, plating resistance, soldering heat resistance and long-term reliability.

The cured product produced by curing the solder resist ink that includes the carboxyl group-containing polyurethane is excellent in adhesion with substrates, low warpage, flexibility, plating resistance, soldering heat resistance and long-term reliability.

BEST MODE FOR CARRYING OUT THE INVENTION

The carboxyl group-containing polyurethane, solution of carboxyl group-containing polyurethane, solder resist ink, and cured product according to the present invention will be described in detail hereinbelow.

[Carboxyl Group-Containing Polyurethane]

The carboxyl group-containing polyurethane according to the invention has a structure derived from a polycarbonate diol (B). The polycarbonate diol (B) has:
(i) a number-average molecular weight of 500 to 50,000;
(ii) an alkylene group of 8 to 18 carbon atoms in its structure; and
(iii) hydroxyl groups at both ends.

The carboxyl group-containing polyurethane may be produced by reacting:
(A) a polyisocyanate compound;
(B) a polycarbonate diol having:
(i) a number-average molecular weight of 500 to 50,000;
(ii) an alkylene group of 8 to 18 carbon atoms in its structure; and
(iii) hydroxyl groups at both ends;
(C) a carboxyl group-containing dihydroxy compound;
(D) an optional monohydroxy compound; and
(E) an optional monoisocyanate compound.

(A) Polyisocyanate Compound

Examples of the polyisocyanate compounds (A) used in the invention include diisocyanates such as 2,4-tolylene diisocyanate, 2,6-tolylene diisocyanate, isophorone diisocyanate, 1,6-hexamethylene diisocyanate, 1,3-trimethylene diisocyanate, 1,4-tetramethylene diisocyanate, 2,2,4-trimethylhexamethylene diisocyanate, 2,4,4-trimethylhexamethylene diisocyanate, 1,9-nonamethylene diisocyanate, 1,10-decamethylene diisocyanate, 1,4-cyclohexane diisocyanate, 2,2'-diethyl ether diisocyanate, diphenylmethane-4,4'-diisocyanate, (o, m or p)-xylene diisocyanate, methylenebis(cyclohexyl isocyanate), cyclohexane-1,3-dimethylene diisocyanate, cyclohexane-1,4-dimethylene diisocyanate, 1,5-naphthalene diisocyanate, p-phenylene diisocyanate, 3,3'-methyleneditolylene-4,4'-diisocyanate, 4,4'-diphenyl ether diisocyanate, tetrachlorophenylene diisocyanate, norbornane diisocyanate and hydrogenated (1,3- or 1,4-)xylylene diisocyanate. The diisocyanates may be used singly or in combination of two or more kinds.

The polyisocyanate compounds (A) generally have two isocyanate groups per molecule. Polyisocyanates having three or more isocyanate groups, such as triphenylmethane triisocyanate, may be used in small amounts as long as such use does not lead to gelation of the polyurethane.

Of the above compounds, the use of alicyclic or aromatic compounds of 6 to 30 carbon atoms except the carbon atom in the isocyanate group (NCO group) leads to the cured product particularly excellent in long-term insulating reliability at high temperatures and high humidities. The alicyclic or aromatic compounds desirably account for not less than 10 mol %, preferably not less than 20 mol %, more preferably not less than 30 mol % of the polyisocyanate compound (A) (100 mol %). Examples of such aromatic and/or alicyclic compounds include 1,4-cyclohexane diisocyanate, isophorone diisocyanate, methylenebis(4-cyclohexyl isocyanate), cyclohexane-1,3-dimethylene diisocyanate, cyclohexane-1,4-dimethylene diisocyanate, hydrogenated (1,3- or 1,4-)xylylene diisocyanate, 2,4-tolylene diisocyanate, 2,6-tolylene diisocyanate and diphenylmethane-4,4'-diisocyanate.

(B) Polycarbonate Diol

The polycarbonate diol (B) used in the invention has a number-average molecular weight of 500 to 50,000; an alkylene group (—$C_nH_{2n}$—) of 8 to 18 carbon atoms in its structure; and hydroxyl groups at both ends.

As used herein, the molecular weight is in terms of polystyrene according to GPC under conditions which will be described later.

The polycarbonate diol (B) having a $C_{8-18}$ alkylene group (—$C_nH_{2n}$—) in its structure may be formed using at least a diol having 8 to 18 carbon atoms as a raw material.

Exemplary processes for producing the polycarbonate diol (B) include ester exchange between a diol as raw material (hereinafter raw material diol) and a carbonate, and dehydrochlorination between a raw material diol and a phosgene.

The polycarbonate diol (B) is represented by Formula (1):

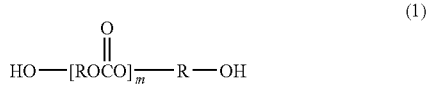

(1)

wherein R is a residue of the raw material diol HO—R—OH by elimination of the OH groups, a plurality of R may be the same or different, and m is a positive integer.

In the polycarbonate diol (B), the $C_{8-18}$ alkylene group desirably accounts for not less than 30 mol %, preferably not less than 50 mol %, more preferably not less than 95 mol % of the total (100 mol %) of R in Formula (1). Such polycarbonate diol may be produced using a raw material diol which contains at least 30 mol % of a $C_{8-18}$ diol relative to the total of the raw material diol.

The raw material diol may contain diols having 7 or less carbon atoms, diols having 19 or more carbon atoms, polyether diols, polybutadienes having hydroxyl groups at both ends, and polyester diols, in addition to the diol having 8 to 18 carbon atoms while still achieving the objects of the invention.

The polycarbonate diol (B) may be produced by ester exchange using a carbonate as raw material. Examples of the carbonates include dialkyl carbonates such as dimethyl carbonate and diethyl carbonate; diaryl carbonates such as diphenyl carbonate; and alkylene carbonates such as ethylene carbonate and propylene carbonate.

The ester exchange between the raw material diol and the carbonate at 100 to 230° C. produces the polycarbonate diol (B). The ester exchange reaction may be performed at an arbitrary pressure, for example at atmospheric or reduced pressure, depending on the progress of the reaction.

The ester exchange reaction may be uncatalyzed, but is desirably catalyzed where fast reaction is desired. Any ester exchange catalysts common in the polycarbonate production may be used herein. Examples of the catalysts include titanium compounds such as tetraisopropoxytitanium and tetra-n-butoxytitanium; tin compounds such as di-n-butyltin dilaurate, di-n-butyltin oxide and dibutyltin diacetate; and combinations of antimony oxide or the titanium compounds with metal acetates such as magnesium acetate, calcium acetate and zinc acetate. The catalysts are desirably used in amounts of 1 to 300 ppm with respect to the reaction product.

Examples of the polycarbonate diols (B) include polycarbonate diols having in their structures alkylene groups such as —$(CH_2)_9$—, —$CH_2$—$CH(CH_3)$—$(CH_2)_6$—, —$(CH_2)_8$—, —$(CH_2)_{10}$— and —$CH((CH_2)_{11}CH_3)$—$CH_2$—. These polycarbonate diols may be produced using respective raw material diols such as 1,9-nonanediol, 2-methyl-1,8-octanediol, 1,8-octanediol, 1,10-decamethylene glycol and 1,2-tetradecane diol.

The polycarbonate diol (B) may be a copolymer of polycarbonate diols (polycarbonate diol copolymer) having a plurality of alkylene groups in its structure. Commercially available such diols include Kuraray Polyol series C-1015N, C-1065N, C-2015N and C-2065N (manufactured by KURARAY CO., LTD.). The polycarbonate diol copolymers are generally advantageous in terms of preventing crystallization of the polyurethane.

In view of the solubility of the polyurethane in a solvent, the polycarbonate diols (B) having a branched structure are preferred, with examples including polycarbonate diol copolymers having in their structures alkylene groups —$(CH_2)_9$— (hereinafter the 1,9-nonane structure) and —$CH_2$—$CH(CH_3)$—$(CH_2)_6$— (hereinafter the 2-methyl-1, 8-octane structure).

In particular, the 2-methyl-1,8-octane structure desirably accounts for not less than 5 mol %, preferably not less than 10 mol %, more preferably not less than 15 mol % of the total (100 mol %) of R in the polycarbonate diol represented by Formula (1).

When the molecular weight of the polycarbonate diol (B) is excessively low, the cured product cannot show desired properties. Excessively high molecular weights result in unfavorable properties, for example, in terms of solubility of the polyurethane in a solvent, and viscosity of the solution of the polyurethane in a solvent. The number-average molecular weight of the polycarbonate diol (B) is preferably in the range of 500 to 5,000, more preferably 1,000 to 4,000.

For the purposes of improving the solubility of the polyurethane in a solvent and of improving the heat resistance of the cured product according to the present invention, polycarbonate diols, polybutadiene diols, polyether polyols, polyester polyols and low molecular weight diols (other than the compound (C)) that are each produced from diols having 7 or less carbon atoms may be used in combination with the polycarbonate diol (B) in an amount of 5 to 80 parts by weight with respect to 100 parts by weight of the polycarbonate diol.

The ester exchange reaction often produces polycarbonates having a hydroxyl group at one end. The polycarbonate diol (B) may contain such by-products in very small amounts, for example not more than 5 wt %.

(C) Carboxyl Group-Containing Dihydroxy Compound

Examples of the carboxyl group-containing dihydroxy compounds (C) include 2,2-dimethylolpropionic acid, 2,2-dimethylolbutanoic acid, N,N-bishydroxyethylglycine and N,N-bishydroxyethylalanine. Of these, 2,2-dimethylolpropionic acid and 2,2-dimethylolbutanoic acid are particularly preferable in view of solubility in a solvent. The carboxyl group-containing dihydroxy compounds may be used singly or in combination of two or more kinds.

(D) Monohydroxy Compound and (E) Monoisocyanate Compound

The carboxyl group-containing polyurethane of the present invention may be synthesized from the aforementioned three components (A), (B) and (C). The synthesis may involve a monohydroxy compound (D) and/or a monoisocyanate compound (E) for the purpose of giving radical or cationic polymerizability to the polyurethane or of eliminating the influence of the isocyanate residue or the hydroxyl group at ends of the polyurethane.

Examples of the monohydroxy compounds (D) used for giving radical or cationic polymerizability to the polyurethane of the present invention include compounds having radically polymerizable double bonds, such as 2-hydroxyethyl (meth)acrylate, hydroxypropyl(meth)acrylate, hydroxybutyl (meth)acrylate, cyclohexanedimethanol mono (meth)acrylate, adducts of the (meth)acrylates with caprolactones or alkylene oxides, glycerin di(meth)acrylate, trimethylol di(meth)acrylate, pentaerythritol tri(meth)acrylate, dipentaerythritol penta(meth)acrylate, ditrimethylolpropane tri(meth)acrylate, allyl alcohol and allyloxy ethanol; and compounds having carboxylic acids, such as glycolic acid and hydroxypivalic acid.

The monohydroxy compounds may be used singly or in combination of two or more kinds. Of the above compounds, 2-hydroxyethyl(meth)acrylate, hydroxypropyl(meth)acrylate, hydroxybutyl(meth)acrylate, allyl alcohol, glycolic acid and hydroxypivalic acid are preferable, and 2-hydroxyethyl (meth)acrylate is more preferable.

Examples of the monohydroxy compounds (D) used for eliminating the influence of the isocyanate residue at ends of the polyurethane of the present invention include the above monohydroxy compounds, methanol, ethanol, n-propanol, isopropanol, n-butanol, isobutanol, sec-butanol, t-butanol, amyl alcohol, hexyl alcohol and octyl alcohol.

Examples of the monoisocyanate compounds (E) include compounds having radical double bonds such as (meth)acryloyloxyethyl isocyanate, and monoadducts of diisocyanate compounds with 2-hydroxyethyl(meth)acrylate, hydroxypropyl(meth)acrylate, hydroxybutyl(meth)acrylate, cyclohexanedimethanol mono(meth)acrylate, adducts of the (meth)acrylates with caprolactones or alkylene oxides, glycerin di(meth)acrylate, trimethylol di(meth)acrylate, pentaerythritol tri(meth)acrylate, dipentaerythritol penta(meth)acrylate, ditrimethylolpropane tri(meth)acrylate, allyl alcohol and allyloxy ethanol.

Examples of the monoisocyanate hydroxy compounds used for eliminating the influence of the terminal hydroxyl residue include phenyl isocyanate, hexyl isocyanate, dodecyl isocyanate, and monoadducts of diisocyanate compounds with methanol, ethanol, n-propanol, isopropanol, n-butanol, isobutanol, sec-butanol, t-butanol, amyl alcohol, hexyl alcohol and octyl alcohol.

<Carboxyl Group-Containing Polyurethane>

The carboxyl group-containing polyurethane of the present invention preferably has a number-average molecular weight of 1,000 to 100,000, more preferably 3,000 to 50,000. The molecular weight as used herein is a value in terms of polystyrene determined by gel permeation chromatography. Molecular weights less than 1,000 often result in poor elongation, flexibility and strength of the cured film obtained. When the molecular weight exceeds 100,000, the polyurethane is less soluble in a solvent and gives an excessively viscous solution, and consequently the use is very limited.

Herein, GPC conditions are as follows unless otherwise mentioned.

Chromatograph: HPLC unit HSS-2000 manufactured by JASCO Corporation
  Column: Shodex Column LF-804
  Eluent: tetrahydrofuran
  Flow rate: 1.0 ml/min
  Detector: RI-2031 Plus manufactured by JASCO Corporation
  Temperature: 40.0° C.
  Sample size: 100 µl placed in a sample loop
  Sample concentration: approximately 0.1 wt %

The carboxyl group-containing polyurethane preferably has an acid value of 5 to 120 mgKOH/g, more preferably 10 to 70 mgKOH/g. When the acid value is less than 5 mgKOH/g, the reactivity with other curable resins such as epoxy resins is often lowered and the heat resistance is often deteriorated. When the acid value exceeds 120 mgKOH/g, the cured film is often too rigid and brittle.

The carboxyl group-containing polyurethane preferably has a number-average molecular weight of 1,000 to 100,000 and an acid value of 5 to 120 mgKOH/g, and more preferably has a number-average molecular weight of 3,000 to 50,000 and an acid value of 10 to 70 mgKOH/g.

Herein, the acid value of the resin is determined by the following method.

Approximately 0.2 g of a sample is weighed in a 100 ml conical flask using a precision balance, and the sample is dissolved by adding 10 ml of an ethanol/toluene mixed solvent (½ by weight). One to three droplets of phenolphthalein/ethanol solution as an indicator are added to the flask, and the mixture is stirred sufficiently to uniformity. The mixture is titrated with a 0.1N potassium hydroxide/ethanol solution, and the end point of neutralization is obtained when the indicator is slightly red for 30 seconds. The results are put to the following equation to calculate the acid value of the resin.

$$\text{Acid value (mgKOH/g)} = [B \times f \times 5.611]/S$$

wherein:
  B: consumption (ml) of 0.05N potassium hydroxide/ethanol solution
  f: factor of 0.05N potassium hydroxide/ethanol solution
  S: amount of sample (g)

The carboxyl group-containing polyurethane may be synthesized by reacting the polyisocyanate (A), polycarbonate diol (B), dihydroxy compound (C), optional monohydroxy compound (D) and optional monoisocyanate compound (E) in the absence or presence of a known urethanization catalyst such as dibutyltin dilaurate, in an appropriate organic solvent. The reaction without the catalyst provides higher properties when the cured film is actually used.

The organic solvent used herein has low reactivity with isocyanates. Desirable solvents are free of basic compounds such as amines and have a boiling point of not less than 30° C., preferably not less than 120° C., and for screen printing not less than 200° C. Examples of such solvents include toluene, xylene, ethylbenzene, nitrobenzene, cyclohexane, isophorone, diethylene glycol dimethyl ether, ethylene glycol diethyl ether, ethylene glycol methyl ether acetate, ethylene glycol ethyl ether acetate, propylene glycol methyl ether acetate, propylene glycol ethyl ether acetate, dipropylene glycol methyl ether acetate, dipropylene glycol ethyl ether acetate, diethylene glycol ethyl ether acetate, diethylene glycol methyl ether acetate, methyl methoxypropionate, ethyl methoxypropionate, methyl ethoxypropionate, ethyl ethoxypropionate, ethyl acetate, n-butyl acetate, isoamyl acetate, ethyl lactate, acetone, methyl ethyl ketone, cyclohexanone, N,N-dimethylformamide, N,N-dimethylacetamide, N-methylpyrrolidone, γ-butyrolactone, dimethylsulfoxide, chloroform and methylene chloride.

Of these, propylene glycol methyl ether acetate, propylene glycol ethyl ether acetate, dipropylene glycol methyl ether acetate, diethylene glycol ethyl ether acetate and γ-butyrolactone are preferable in view of the facts that the organic solvents in which the carboxyl group-containing polyurethane shows low solubility are not preferable and that the polyurethane has an application in electronic materials in which it is used as a material of inks.

The screen printing entails solvents having relatively high boiling points. When it is necessary that the reaction use a low-boiling solvent because of solubility of the materials or the like, the polyurethane may be synthesized using such low-boiling solvent and the solvent may be substituted with a high-boiling solvent after the synthesis.

The addition sequence of the materials is not particularly limited. Generally, the polycarbonate diol (B) and dihydroxy compound (C) are fed first and dissolved in the solvent, and the diisocyanate compound (A) is added dropwise at 20 to 150° C., more preferably 60 to 120° C., and these are reacted together at 30 to 160° C., more preferably 50 to 130° C.

The molar ratio of the materials is controlled depending on an objective molecular weight and acid value of the polyurethane. When the monohydroxy compound (D) is introduced in the polyurethane, it is necessary that the diisocyanate compound (A) be used in excess over the polycarbonate diol (B) and dihydroxy compound (C) (so that the isocyanate groups are excess over the total hydroxyl groups) such that the polyurethane molecule is terminated with the isocyanate groups.

Specifically, the molar ratio diisocyanate compound (A): (polycarbonate diol (B)+dihydroxy compound (C)) is in the range of 0.5-1.5:1, preferably 0.8-1.2:1.

The molar ratio polycarbonate diol (B):dihydroxy compound (C) is in the range of 1:0.1-30, preferably 1:0.3-10.

When the monohydroxy compound (D) is used, it is preferable that the number of moles of the diisocyanate compound (A) be excess over that of the polycarbonate diol (B) plus the dihydroxy compound (C), and the molar amount of the monohydroxy compound (D) be 0.5 to 1.5 times, preferably 0.8 to 1.2 times the excessive moles of the NCO groups.

When the monoisocyanate compound (E) is used, it is preferable that the number of moles of the polycarbonate diol (B) plus the dihydroxy compound (C) be excess over that of the diisocyanate compound (A), and the molar amount of the monoisocyanate compound (E) be 0.5 to 1.5 times, preferably 0.8 to 1.2 times the excessive moles of the hydroxyl groups.

To introduce the monohydroxy compound (D) in the polyurethane, the monohydroxy compound (D) is added dropwise to the solution of the polyurethane at 20 to 150° C., more preferably 70 to 120° C. when the reaction of the polycarbonate diol (B) and dihydroxy compound (C) with the diisocyanate (A) has substantially terminated, whereby the isocyanate groups remaining at both ends of the polyurethane are reacted with the monohydroxy compound (D); thereafter the temperature is maintained constant to allow the reaction to complete.

To introduce the monoisocyanate compound (E) in the polyurethane, the monoisocyanate compound (E) is added dropwise to the solution of the polyurethane at 20 to 150° C., more preferably 50 to 120° C. when the reaction of the polycarbonate diol (B) and dihydroxy compound (C) with the diisocyanate (A) has substantially terminated, whereby the hydroxyl groups remaining at both ends of the polyurethane are reacted with the monoisocyanate compound (E); thereafter the temperature is maintained constant to allow the reaction to complete.

[Solution of Carboxyl Group-Containing Polyurethane]

The solution of carboxyl group-containing polyurethane (the heat-curable polyurethane resin composition) according to the present invention includes the carboxyl group-containing polyurethane and a solvent, and the carboxyl group-containing polyurethane is dissolved in the solvent.

The organic solvents described above may be favorably used as the solvent herein.

The solution of carboxyl group-containing polyurethane preferably has a concentration of the carboxyl group-containing polyurethane (solid concentration) of 10 to 90 wt %, more preferably 30 to 80 wt %.

The solution of carboxyl group-containing polyurethane may be cured as follows. The composition is mixed with other heat-curable resins such as epoxy resins, curing catalysts and anti-foaming agents as required to produce a solder resist ink, and the ink is applied by screen printing or the like, followed by drying and heating.

Examples of the epoxy resins used herein include:

bisphenol A epoxy resins such as EPIKOTE series 828, 1002 and 1004 manufactured by JAPAN EPOXY RESIN CO., LTD.;

bisphenol F epoxy resins such as EPIKOTE series 806, 807 and 4005P manufactured by JAPAN EPOXY RESIN CO., LTD., and YDF-170 manufactured by Tohto Kasei Co., Ltd.;

phenol novolak epoxy resins such as EPIKOTE series 152 and 154 manufactured by JAPAN EPOXY RESIN CO., LTD., and EPPN-201 manufactured by NIPPON KAYAKU CO., LTD.;

o-cresol novolak epoxy resins such as EOCN series 125S, 103S and 104S manufactured by NIPPON KAYAKU CO., LTD.;

biphenyl epoxy resins such as EPIKOTE series YX-4000 and YL-6640 manufactured by JAPAN EPOXY RESIN CO., LTD., polyfunctional epoxy resins such as EPIKOTE 1031S manufactured by JAPAN EPOXY RESIN CO., LTD., Araldite 0163 manufactured by Ciba Specialty Chemicals Inc., and DENACOL series EX-611, EX-614, EX-614B, EX-622, EX-512, EX-521, EX-421, E-411 and EX-321 manufactured by Nagase Kasei Kogyo K.K.;

amine epoxy resins such as EPIKOTE 604 manufactured by JAPAN EPOXY RESIN CO., LTD., YH-434 manufactured by Tohto Kasei Co., Ltd., TETRAD-X and TETRAD-C manufactured by MITSUBISHI GAS CHEMICAL COMPANY, INC., GAN manufactured by NIPPON KAYAKU CO., LTD., and ELM-120 manufactured by Sumitomo Chemical Co., Ltd.;

heterocyclic epoxy resins such as Araldite PT810 manufactured by Ciba Specialty Chemicals Inc.;

alicyclic epoxy resins such as EHPE 3150, EHPE 3150CE, CELLOXIDE 2000, CELLOXIDE 2021, CELLOXIDE 2081, EPOLEAD PB3600 and EPOLEAD GT401 manufactured by DAICEL CHEMICAL INDUSTRIES, LTD., and ERL series 4234, 4299, 4221 and 4206 manufactured by UCC; and epoxidized polybutadienes such as EPOLEAD PB3600 manufactured by DAICEL CHEMICAL INDUSTRIES, LTD.

These may be used singly or in combination of two or more kinds.

Of the epoxy resins, the bisphenol A epoxy resins, bisphenol F epoxy resins, biphenyl epoxy resins and alicyclic epoxy resins are more preferable in terms of mechanical properties, adhesion and flexibility. The epoxy equivalent is preferably in the range of 120 to 20,000, more preferably 150 to 2,000.

The amount of the epoxy resins is from 1 to 100 parts by weight, preferably from 5 to 50 parts by weight based on 100 parts by weight of the carboxyl group-containing polyurethane. Amounts of the epoxy resins less than 1 part by weight can lead to reduction of heat resistance, adhesion and flexibility. When the amount exceeds 100 parts by weight, the warpage resistance and mechanical strength can be deteriorated.

The equivalent ratio of the epoxy groups in the epoxy resin to the acid groups in the carboxyl group-containing polyurethane is desirably in the range of 0.2 to 2, preferably 0.5 to 1.5. When the ratio is less than 0.2, the heat-curable resin composition can show lower curability. When the ratio is above 2, the storage stability can be deteriorated.

The cured products produced as described above are excellent in adhesion with substrates, low warpage, flexibility, plating resistance, soldering heat resistance and long-term reliability.

EXAMPLES

The present invention will be described in greater detail by examples below, but it should be construed that the invention is in no way limited to such examples.

Example 1

A reaction vessel equipped with a stirrer, a thermometer and a condenser was charged with 70.7 g of polycarbonate diol C-1065N (manufactured by KURARAY CO., LTD., molar ratio of raw material diols (1,9-nonanediol:2-methyl-1,8-octanediol) 65:35, molecular weight: 991), 13.5 g of carboxyl group-containing dihydroxy compound 2,2-dimethylolbutanoic acid (manufactured by Nippon Kasei Chemical Co., Ltd.) and 128.9 g of diethylene glycol ethyl ether acetate as solvent (manufactured by DAICEL CHEMICAL INDUSTRIES, LTD.). The materials were dissolved at 90° C. The reaction liquid was cooled to 70° C., and 42.4 g of polyisocyanate DESMODUR W (manufactured by Sumika Bayer Urethane Co., Ltd.) was added dropwise with a dropping funnel over a period of 30 minutes. After the completion of the dropwise addition, reaction was performed at 80° C. for 1 hour, 90° C. for 1 hour, and 100° C. for 2 hours. When the substantial disappearance of the isocyanate was confirmed, 1.46 g of isobutanol (manufactured by Wako Pure Chemical Industries, Ltd.) was added dropwise and reaction was performed at 105° C. for 1.5 hours.

The carboxyl group-containing polyurethane obtained had a number-average molecular weight of 6,800 and an acid value of the solid of 39.9 mgKOH/g.

Example 2

A reaction vessel equipped with a stirrer, a thermometer and a condenser was charged with 305.0 g of polycarbonate diol C-2015N (manufactured by KURARAY CO., LTD., molar ratio of raw material diols (1,9-nonanediol:2-methyl-1,8-octanediol)=15:85, molecular weight: 1945), 52.4 g of carboxyl group-containing dihydroxy compound 2,2-dimethylolbutanoic acid (manufactured by Nippon Kasei Chemical Co., Ltd.) and 494.9 g of diethylene glycol ethyl ether acetate as solvent (manufactured by DAICEL CHEMICAL INDUSTRIES, LTD.). The materials were dissolved at 90° C. The reaction liquid was cooled to 70° C., and 133.8 g of polyisocyanate DESMODUR W (manufactured by Sumika Bayer Urethane Co., Ltd.) was added dropwise with a dropping funnel over a period of 30 minutes. After the completion of the dropwise addition, reaction was performed at 80° C. for 1 hour, 90° C. for 1 hour, and 100° C. for 1.5 hours. When the substantial disappearance of the isocyanate was confirmed, 3.92 g of isobutanol (manufactured by Wako Pure Chemical Industries, Ltd.) was added dropwise and reaction was performed at 105° C. for 2 hours.

The carboxyl group-containing polyurethane obtained had a number-average molecular weight of 9,080 and an acid value of the solid of 40.1 mgKOH/g.

Example 3

A reaction vessel equipped with a stirrer, a thermometer and a condenser was charged with 718.2 g of polycarbonate diol C-1015N (manufactured by KURARAY CO., LTD., molar ratio of raw material diols (1,9-nonanediol:2-methyl-1,8-octanediol) 15:85, molecular weight: 964), 136.6 g of carboxyl group-containing dihydroxy compound 2,2-dimethylolbutanoic acid (manufactured by Nippon Kasei Chemical Co., Ltd.) and 1,293 g of diethylene glycol ethyl ether acetate as solvent (manufactured by DAICEL CHEMICAL INDUSTRIES, LTD.). The materials were dissolved at 90° C. The reaction liquid was cooled to 70° C., and 237.5 g of polyisocyanate DESMODUR W (manufactured by Sumika Bayer Urethane Co., Ltd.) was added dropwise with a dropping funnel over a period of 30 minutes. After the completion of the dropwise addition, reaction was performed at 80° C. for 1 hour, 90° C. for 1 hour, and 100° C. for 1.5 hours. When the substantial disappearance of the isocyanate was confirmed, 2.13 g of isobutanol (manufactured by Wako Pure Chemical Industries, Ltd.) was added dropwise and reaction was performed at 105° C. for 1 hour.

The carboxyl group-containing polyurethane obtained had a number-average molecular weight of 6,090 and an acid value of the solid of 40.0 mgKOH/g.

Example 4

A reaction vessel equipped with a stirrer, a thermometer and a condenser was charged with 62.2 g of polycarbonate diol C-2065N (manufactured by KURARAY CO., LTD., molar ratio of raw material diols (1,9-nonanediol:2-methyl-1,8-octanediol)=65:35, molecular weight: 1931), 10.4 g of carboxyl group-containing dihydroxy compound 2,2-dimethylolbutanoic acid (manufactured by Nippon Kasei Chemical Co., Ltd.) and 100.4 g of diethylene glycol ethyl ether acetate as solvent (manufactured by DAICEL CHEMICAL INDUSTRIES, LTD.). The materials were dissolved at 90° C. The reaction liquid was cooled to 70° C., and 26.8 g of polyisocyanate DESMODUR W (manufactured by Sumika Bayer Urethane Co., Ltd.) was added dropwise with a dropping funnel over a period of 30 minutes. After the completion of the dropwise addition, reaction was performed at 80° C. for 1 hour, 90° C. for 1 hour, and 100° C. for 1.5 hours. When the substantial disappearance of the isocyanate was confirmed, 1.52 g of isobutanol (manufactured by Wako Pure Chemical Industries, Ltd.) was added dropwise and reaction was performed at 105° C. for 1 hour.

The carboxyl group-containing polyurethane obtained had a number-average molecular weight of 10, 300 and an acid value of the solid of 39.1 mgKOH/g.

Example 5

A reaction vessel equipped with a stirrer, a thermometer and a condenser was charged with 67.5 g of polycarbonate diol C-1015N (manufactured by KURARAY CO., LTD., molar ratio of raw material diols (1,9-nonanediol:2-methyl-1,8-octanediol)=15:85, molecular weight: 964), 10.8 g of carboxyl group-containing dihydroxy compound 2,2-dimethylolbutanoic acid (manufactured by Nippon Kasei Chemical Co., Ltd.) and 117.4 g of diethylene glycol ethyl ether acetate as solvent (manufactured by DAICEL CHEMICAL INDUSTRIES, LTD.). The materials were dissolved at 90° C. The reaction liquid was cooled to 70° C., and 37.6 g of polyisocyanate DESMODUR W (manufactured by Sumika Bayer Urethane Co., Ltd.) was added dropwise with a dropping funnel over a period of 30 minutes. After the completion of the dropwise addition, reaction was performed at 80° C. for 1 hour, 90° C. for 1 hour, and 100° C. for 1.5 hours. When the substantial disappearance of the isocyanate was confirmed, 1.49 g of isobutanol (manufactured by Wako Pure Chemical Industries, Ltd.) was added dropwise and reaction was performed at 105° C. for 1 hour.

The carboxyl group-containing polyurethane obtained had a number-average molecular weight of 7,930 and an acid value of the solid of 34.9 mgKOH/g.

Example 6

A reaction vessel equipped with a stirrer, a thermometer and a condenser was charged with 60.7 g of polycarbonate diol C-1015N (manufactured by KURARAY CO., LTD., molar ratio of raw material diols (1,9-nonanediol:2-methyl-1,8-octanediol)=15:85, molecular weight: 964), 13.9 g of carboxyl group-containing dihydroxy compound 2,2-dimethylolbutanoic acid (manufactured by Nippon Kasei Chemical Co., Ltd.) and 117.0 g of diethylene glycol ethyl ether acetate as solvent (manufactured by DAICEL CHEMICAL INDUSTRIES, LTD.). The materials were dissolved at 90° C. The reaction liquid was cooled to 70° C., and 41.2 g of polyisocyanate DESMODUR W (manufactured by Sumika Bayer Urethane Co., Ltd.) was added dropwise with a dropping funnel over a period of 30 minutes. After the completion of the dropwise addition, reaction was performed at 80° C. for 1 hour, 90° C. for 1 hour, and 100° C. for 1.5 hours. When the substantial disappearance of the isocyanate was confirmed, 1.43 g of isobutanol (manufactured by Wako Pure Chemical Industries, Ltd.) was added dropwise and reaction was performed at 105° C. for 1 hour.

The carboxyl group-containing polyurethane obtained had a number-average molecular weight of 8,060 and an acid value of the solid of 44.9 mgKOH/g.

Example 7

A reaction vessel equipped with a stirrer, a thermometer and a condenser was charged with 71.3 g of polycarbonate diol C-1015N (manufactured by KURARAY CO., LTD., molar ratio of raw material diols (1,9-nonanediol:2-methyl-1,8-octanediol)=15:85, molecular weight: 964), 12.1 g of carboxyl group-containing dihydroxy compound 2,2-dimethylolpropionic acid (manufactured by Nippon Kasei Chemical Co., Ltd.) and 126.4 g of ethylene glycol methyl ether acetate as solvent (manufactured by DAICEL CHEMICAL INDUSTRIES, LTD.). While the reaction liquid was at 70° C., 43.0 g of polyisocyanate DESMODUR W (manufactured by Sumika Bayer Urethane Co., Ltd.) was added dropwise with a dropping funnel over a period of 30 minutes. After the completion of the dropwise addition, reaction was performed at 80° C. for 1 hour, 90° C. for 1 hour, and 100° C. for 3 hours. When the substantial disappearance of the isocyanate was confirmed, 1.21 g of isobutanol (manufactured by Wako Pure Chemical Industries, Ltd.) was added dropwise and reaction was performed at 105° C. for 1 hour.

The carboxyl group-containing polyurethane obtained had a number-average molecular weight of 7,460 and an acid value of the solid of 40.0 mgKOH/g.

Example 8

A reaction vessel equipped with a stirrer, a thermometer and a condenser was charged with 79.5 g of polycarbonate diol C-1015N (manufactured by KURARAY CO., LTD., molar ratio of raw material diols (1,9-nonanediol:2-methyl-1,8-octanediol)=15:85, molecular weight: 964), 13.3 g of carboxyl group-containing dihydroxy compound 2,2-dimethylolbutanoic acid (manufactured by Nippon Kasei Chemical Co., Ltd.) and 126.3 g of γ-butyrolactone as solvent (manufactured by Mitsubishi Chemical Corporation). The materials were dissolved at 90° C. The reaction liquid was cooled to 70° C., and 33.5 g of polyisocyanate TAKENATE 600 (manufactured by MITSUI TAKEDA CHEMICALS, INC.) was added dropwise with a dropping funnel over a period of 30 minutes. After the completion of the dropwise addition, reaction was performed at 80° C. for 1 hour, 90° C. for 1 hour, and 100° C. for 1.5 hours. When the substantial disappearance of the isocyanate was confirmed, 1.26 g of isobutanol (manufactured by Wako Pure Chemical Industries, Ltd.) was added dropwise and reaction was performed at 105° C. for 1 hour.

The carboxyl group-containing polyurethane obtained had a number-average molecular weight of 9,200 and an acid value of the solid of 40.3 mgKOH/g.

Example 9

A reaction vessel equipped with a stirrer, a thermometer and a condenser was charged with 71.6 g of polycarbonate diol C-1015N (manufactured by KURARAY CO., LTD., molar ratio of raw material diols (1,9-nonanediol:2-methyl-1,8-octanediol)=15:85, molecular weight: 964), 13.3 g of carboxyl group-containing dihydroxy compound 2,2-dimethylolbutanoic acid (manufactured by Nippon Kasei Chemical Co., Ltd.) and 125.9 g of diethylene glycol ethyl ether acetate as solvent (manufactured by DAICEL CHEMICAL INDUSTRIES, LTD.). The materials were dissolved at 90° C. The reaction liquid was cooled to room temperature, and 41.0 g of polyisocyanate COSMONATE PH in a molten state (manufactured by MITSUI TAKEDA CHEMICALS, INC.) was added. Thereafter, reaction was performed at 50° C. for 1 hour, 60° C. for 1 hour, and 80° C. for 3 hours. When the substantial disappearance of the isocyanate was confirmed, 2.00 g of isobutanol (manufactured by Wako Pure Chemical Industries, Ltd.) was added dropwise and reaction was performed at 100° C. for 1 hour.

The carboxyl group-containing polyurethane obtained had a number-average molecular weight of 10,800 and an acid value of the solid of 39.8 mgKOH/g.

Example 10

A reaction vessel equipped with a stirrer, a thermometer and a condenser was charged with 147.3 g of polycarbonate diol C-1015N (manufactured by KURARAY CO., LTD., molar ratio of raw material diols (1,9-nonanediol:2-methyl-1,8-octanediol)=15:85, molecular weight: 964), 26.8 g of carboxyl group-containing dihydroxy compound 2,2-dimethylolpropionic acid (manufactured by Nippon Kasei Chemical Co., Ltd.) and 253.2 g of ethylene glycol methyl ether acetate as solvent (manufactured by DAICEL CHEMICAL INDUSTRIES, LTD.). The materials were dissolved at 90° C. The reaction liquid was cooled to 70° C., and 64.5 g of polyisocyanate COSMONATE T-80 (manufactured by MITSUI TAKEDA CHEMICALS, INC.) was added dropwise with a dropping funnel over a period of 30 minutes. After the completion of the dropwise addition, reaction was performed at 70° C. for 1 hour, 80° C. for 1 hour, and 100° C. for 1 hour. Thereafter, 14.7 g of cyclohexanedimethanol monoacrylate (manufactured by Nippon Kasei Chemical Co., Ltd.) and 0.127 g of polymerization inhibitor IRGANOX 1010 (manufactured by Ciba Specialty Chemicals Inc.) were added dropwise and reaction was performed at 100° C. for 1 hour.

The carboxyl group-containing polyurethane obtained had a number-average molecular weight of 6,530 and an acid value of the solid of 40.1 mgKOH/g.

Example 11

A reaction vessel equipped with a stirrer, a thermometer and a condenser was charged with 72.5 g of polycarbonate diol C-1015N (manufactured by KURARAY CO., LTD., molar ratio of raw material diols (1,9-nonanediol:2-methyl-1,8-octanediol)=15:85, molecular weight: 964), 14.0 g of carboxyl group-containing dihydroxy compound 2,2-dimethylolpropionic acid (manufactured by Nippon Kasei Chemical Co., Ltd.) and 132.8 g of ethylene glycol methyl ether acetate as solvent (manufactured by DAICEL CHEMICAL INDUSTRIES, LTD.). The materials were dissolved at 90° C. The reaction liquid was cooled to 70° C., and 41.9 g of polyisocyanate DESMODUR I (manufactured by Sumika Bayer Urethane Co., Ltd.) was added dropwise with a dropping funnel over a period of 30 minutes. After the completion of the dropwise addition, reaction was performed at 90° C. for 1 hour, and 100° C. for 3 hours. Thereafter, 4.38 g of 2-hydroxyethyl acrylate (manufactured by OSAKA ORGANIC CHEMICAL INDUSTRY LTD.) and 0.0664 g of polymerization inhibitor IRGANOX 1010 (manufactured by Ciba Specialty Chemicals Inc.) were added dropwise and reaction was performed at 105° C. for 1 hour.

The carboxyl group-containing polyurethane obtained had a number-average molecular weight of 7,040 and an acid value of the solid of 38.6 mgKOH/g.

Example 12

A reaction vessel equipped with a stirrer, a thermometer and a condenser was charged with 83.3 g of polycarbonate diol C-1015N (manufactured by KURARAY CO., LTD., molar ratio of raw material diols (1,9-nonanediol:2-methyl-1,8-octanediol) 15:85, molecular weight: 964), 8.71 g of carboxyl group-containing dihydroxy compound 2,2-dimethylolpropionic acid (manufactured by Nippon Kasei Chemical Co., Ltd.) and 127.8 g of ethylene glycol methyl ether acetate as solvent (manufactured by DAICEL CHEMICAL INDUSTRIES, LTD.). The materials were dissolved at 90° C. The reaction liquid was cooled to 70° C., and 33.3 g of polyisocyanate norbornane diisocyanate (manufactured by MITSUI TAKEDA CHEMICALS, INC.) was added dropwise with a dropping funnel over a period of 30 minutes. After the completion of the dropwise addition, reaction was performed at 80° C. for 1 hour, 90° C. for 1 hour, and 100° C. for 1 hour. Thereafter, 2.45 g of solid glycolic acid (manufactured by Tokyo Chemical Industry Co., Ltd.) was added and reaction was performed at 100° C. for 1 hour.

The carboxyl group-containing polyurethane obtained had a number-average molecular weight of 6,710 and an acid value of the solid of 42.3 mgKOH/g.

Example 13

A reaction vessel equipped with a stirrer, a thermometer and a condenser was charged with 35.7 g of polycarbonate diol C-1015N (manufactured by KURARAY CO., LTD., molar ratio of raw material diols (1,9-nonanediol:2-methyl-1,8-octanediol)=15:85, molecular weight: 964), 36.1 g of polycarbonate diol UC-CARB 100 (manufactured by UBE INDUSTRIES, LTD., based on 1,4-cyclohexanedimethanol, molecular weight: 1005), 13.6 g of carboxyl group-containing dihydroxy compound 2,2-dimethylolbutanoic acid (manufactured by Nippon Kasei Chemical Co., Ltd.) and 128.2 g of diethylene glycol ethyl ether acetate as solvent (manufactured by DAICEL CHEMICAL INDUSTRIES, LTD.). The materials were dissolved at 90° C. The reaction liquid was cooled to 70° C., and 43.3 g of polyisocyanate DESMODUR W (manufactured by Sumika Bayer Urethane Co., Ltd.) was added dropwise with a dropping funnel over a period of 30 minutes. After the completion of the dropwise addition, reaction was performed at 80° C. for 1 hour, 90° C. for 1 hour, and 100° C. for 1.5 hours. When the substantial disappearance of the isocyanate was confirmed, 1.74 g of isobutanol (manufactured by Wako Pure Chemical Industries, Ltd.) was added dropwise and reaction was performed at 105° C. for 1 hour.

The carboxyl group-containing polyurethane obtained had a number-average molecular weight of 6,050 and an acid value of the solid of 39.6 mgKOH/g.

Example 14

A reaction vessel equipped with a stirrer, a thermometer and a condenser was charged with 42.2 g of polycarbonate diol C-1015N (manufactured by KURARAY CO., LTD., molar ratio of raw material diols (1,9-nonanediol:2-methyl-1,8-octanediol)=15:85, molecular weight: 964), 41.7 g of polycarbonate diol G-1000 (1,2-polybutadiene having hydroxyl groups at both ends, manufactured by NIPPON SODA CO., LTD., molecular weight: 1548), 13.9 g of carboxyl group-containing dihydroxy compound 2,2-dimethylolbutanoic acid (manufactured by Nippon Kasei Chemical Co., Ltd.) and 128.2 g of diethylene glycol ethyl ether acetate as solvent (manufactured by DAICEL CHEMICAL INDUSTRIES, LTD.). The materials were dissolved at 90° C. The reaction liquid was cooled to 70° C., and 31.4 g of polyisocyanate TAKENATE 600 (manufactured by MITSUI TAKEDA CHEMICALS, INC.) was added dropwise with a dropping funnel over a period of 30 minutes. After the completion of the dropwise addition, reaction was performed at 80° C. for 1 hour, 90° C. for 1 hour, and 100° C. for 1.5 hours. When the substantial disappearance of the isocyanate was confirmed, 1.18 g of isobutanol (manufactured by Wako Pure Chemical Industries, Ltd.) was added dropwise and reaction was performed at 105° C. for 1 hour.

The carboxyl group-containing polyurethane obtained had a number-average molecular weight of 8,520 and an acid value of the solid of 40.5 mgKOH/g.

Comparative Example 1

A reaction vessel equipped with a stirrer, a thermometer and a condenser was charged with 56.1 g of polycarbonate diol Kuraray Polyol C-1090 (polycarbonate diol copolymer including 1,6-hexanediol and 3-methyl-1,5-pentanediol in 10:90 molar ratio, manufactured by KURARAY CO., LTD.), 10.4 g (0.070 mol) of carboxyl group-containing dihydroxy compound 2,2-dimethylolbutanoic acid and 100.0 g of diethylene glycol ethyl ether acetate as solvent. The materials were dissolved at 90° C. 33.6 g (0.13 mol) of polyisocyanate DESMODUR W (manufactured by Sumika Bayer Urethane Co., Ltd.) was added dropwise with a dropping funnel over a period of 30 minutes. After the completion of the dropwise addition, reaction was performed at 80° C. for 1 hour, 90° C. for 1 hour, and 100° C. for 1.5 hours. When the substantial disappearance of the isocyanate was confirmed, 2.4 g (0.032 mol) of isobutanol (manufactured by Wako Pure Chemical Industries, Ltd.) was added dropwise and reaction was performed at 100° C. for 30 minutes.

The carboxyl group-containing polyurethane obtained had a number-average molecular weight of 9,500 and an acid value of the solid of 40.0 mgKOH/g.

Comparative Example 2

A reaction vessel equipped with a stirrer, a thermometer and a condenser was charged with 38.7 g of polycarbonate diol UC-CARB 100 (polycarbonate diol with cyclohexanedimethanol as raw material diol, manufactured by UBE INDUSTRIES, LTD.), 18.5 g (0.125 mol) of carboxyl group-containing dihydroxy compound 2,2-dimethylolbutanoic acid and 102.5 g of diethylene glycol ethyl ether acetate as solvent. The materials were dissolved at 90° C. 42.9 g (0.16 mol) of polyisocyanate DESMODUR W (manufactured by Sumika Bayer Urethane Co., Ltd.) was added dropwise with a dropping funnel over a period of 30 minutes. After the completion of the dropwise addition, reaction was performed at 80° C. for 1 hour, 90° C. for 1 hour, and 100° C. for 1.5 hours. When the substantial disappearance of the isocyanate was confirmed, 2.5 g (0.034 mol) of isobutanol (manufactured by Wako Pure Chemical Industries, Ltd.) was added dropwise and reaction was performed at 100° C. for 30 minutes.

The carboxyl group-containing polyurethane obtained had a number-average molecular weight of 12,600 and an acid value of the solid of 68.3 mgKOH/g.

Comparative Example 3

A reaction vessel equipped with a stirrer, a thermometer and a condenser was charged with 65.5 g of polyether polyol PTXG-1800 (polyether copolymer including 1,4-butanediol and neopentyl glycol, manufactured by ASAHI KASEI FIBERS CORPORATION), 11.3 g (0.076 mol) of carboxyl group-containing dihydroxy compound 2,2-dimethylolbutanoic acid and 106.3 g of diethylene glycol ethyl ether acetate as solvent. The materials were dissolved at 90° C. 29.3 g (0.11 mol) of polyisocyanate DESMODUR W (manufactured by Sumika Bayer Urethane Co., Ltd.) was added dropwise with a dropping funnel over a period of 30 minutes. After the completion of the dropwise addition, reaction was performed at 80° C. for 1 hour, 90° C. for 1 hour, and 100° C. for 1 hour. When the substantial disappearance of the isocyanate was confirmed, 1.7 g (0.023 mol) of isobutanol (manufactured by Wako Pure Chemical Industries, Ltd.) was added dropwise and reaction was performed at 100° C. for 1.5 hours.

The carboxyl group-containing polyurethane obtained had a number-average molecular weight of 9,000 and an acid value of the solid of 39.7 mgKOH/g.

Comparative Example 4

A reaction vessel equipped with a stirrer, a thermometer and a condenser was charged with 62.5 g of polyester polyol Kuraray Polyol P-2030 (polyester polyol copolymer including isophthalic acid and 3-methyl-1,5-pentanediol, manufactured by KURARAY CO., LTD.), 10.4 g (0.070 mol) of carboxyl group-containing dihydroxy compound 2,2-dimethylolbutanoic acid and 101.5 g of diethylene glycol ethyl ether acetate as solvent. The materials were dissolved at 90° C. 26.8 g (0.10 mol) of polyisocyanate DESMODUR W (manufactured by Sumika Bayer Urethane Co., Ltd.) was added dropwise with a dropping funnel over a period of 30 minutes. After the completion of the dropwise addition, reaction was performed at 80° C. for 1 hour, 90° C. for 1 hour, and 100° C. for 1.5 hours. When the substantial disappearance of the isocyanate was confirmed, 1.5 g (0.021 mol) of isobutanol (manufactured by Wako Pure Chemical Industries, Ltd.) was added dropwise and reaction was performed at 100° C. for 30 minutes.

The carboxyl group-containing polyurethane obtained had a number-average molecular weight of 10,400 and an acid value of the solid of 40.3 mgKOH/g.

Comparative Example 5

A reaction vessel equipped with a stirrer, a thermometer and a condenser was charged with 59.9 g of polycarbonate diol PCDL T5651 (polycarbonate diol copolymer including 1,6-hexanediol and 1,5-pentanediol, manufactured by Asahi Kasei Chemicals Corporation), 50.5 g (0.34 mol) of carboxyl group-containing dihydroxy compound 2,2-dimethylolbutanoic acid and 209.0 g of propylene glycol methyl ether acetate as solvent. The materials were dissolved at 90° C. 87.4 g (0.45 mol) of polyisocyanate TAKENATE 600 (manufactured by MITSUI TAKEDA CHEMICALS, INC.) was added dropwise with a dropping funnel over a period of 30 minutes. After the completion of the dropwise addition, reaction was performed at 80° C. for 1 hour, 90° C. for 1 hour, and 100° C. for 1.5 hours. When the substantial disappearance of the isocyanate was confirmed, 11.6 g (0.10 mol) of 2-hydroxyethyl acrylate (manufactured by OSAKA ORGANIC CHEMICAL INDUSTRY LTD.) was added dropwise and reaction was performed at 100° C. for 30 minutes.

The carboxyl group-containing polyurethane obtained had a number-average molecular weight of 10,400 and an acid value of the solid of 40.3 mgKOH/g.

[Evaluation of Resist Compositions]
<Preparation of Solder Resist Inks>

A composition contained:

the polyurethane solution (heat-curable polyurethane resin composition) (solid concentration: 50% by mass) obtained in Example 1;

an epoxy resin (EPIKOTE 828 EL, manufactured by JAPAN EPOXY RESIN CO., LTD.) in an amount such that the epoxy equivalent was 1.1 times the equivalent weight of the carboxyl groups of the polyurethane;

melamine as curing catalyst in an amount of 4 wt % relative to 100 wt % of the solid polyurethane; and anti-foaming agent BYK-051 (manufactured by BYK Chemie Japan K.K.) in an amount of 0.75 wt % relative to 100 wt % of the solid polyurethane. The composition was kneaded by being passed through a three-roll mill (RIII-1 RM-2 manufactured by Kodaira Seisakusho Co., Ltd.) three times. Consequently, a solder resist ink was prepared.

Solder resist inks were prepared in the same manner as described above with the polyurethane solutions (heat-curable polyurethane resin compositions) of Examples 2-7, 14 and Comparative Examples 1-5.

<Evaluation of Cured Products>

The adhesion, warpage, flexibility, plating resistance, soldering heat resistance and long-term reliability were evaluated as described below. The results are shown in Table 1.

[Adhesion]

The solder resist ink was applied on a 75 μm thick polyimide film (KAPTON® 300H, manufactured by DUPONT-TORAY CO., LTD.) by screen printing through a No. 100-mesh polyester plate. The printed film was dried at 80° C. for 30 minutes, and the ink was cured at 150° C. for 1 hour. The film with the heat-cured ink was subjected to a cross-cut test according to JIS K 5600.

[Warpage]

The solder resist ink was applied on a 25 μm thick polyimide film (KAPTON® 300H, manufactured by DUPONT-TORAY CO., LTD.) by screen printing through a No. 100-mesh polyester plate. The printed film was dried at 80° C. for 30 minutes, and the ink was cured at 150° C. for 1 hour. The film with the heat-cured ink was cut to a circle 50 mm in diameter. The circle film was placed with the printed surface upside and was evaluated based on the following criteria.

AA: Maximum warp was less than 5 mm high.
CC: Maximum warp was not less than 5 mm high.

[Flexibility]

The solder resist ink was applied on a substrate by screen printing through a No. 100-mesh polyester plate. The ink was dried at 80° C. for 30 minutes, and cured at 150° C. for 1 hour. The substrate used was a 25 μm thick polyimide film (KAPTON® 100H, manufactured by DUPONT-TORAY CO., LTD.). The polyimide film with the heat-cured solder resist ink was bent 180° with the coated surface outward, and the occurrence of blushing in the cured film was checked. The flexibility was evaluated based on the following criteria.

AA: No blushing occurred in the cured film.
CC: Blushing or cracks occurred in the cured film.

[Plating Resistance]

A printed board (UPICEL® N manufactured by UBE INDUSTRIES, LTD.), consisting of a polyimide film (50 μm thick) and a copper foil (35 μm thick) on one surface of the polyimide film, was washed with acid degreasing agent AC-401 and rinsed with water, followed by drying at 70° C. for 3 minutes. The solder resist ink was applied on the board by screen printing through a No. 100-mesh polyester plate. The ink was dried at 80° C. for 30 minutes, and cured at 150° C. for 1 hour, followed by rinsing with water. The board was soaked in acid degreasing agent ICP Clean 91 at 23° C. for 1 minute, rinsed with water, soaked in a 10% aqueous sulfuric acid solution at 23° C. for 1 minute, and rinsed with water. Thereafter, the board was soaked in a tin plating solution (TINPOSIT LT-34, manufactured by Rohm and Hass Company) at 70° C. for 3 minutes, rinsed with water, and soaked in warm water at 70° C. for 3 minutes. The plated board was heat treated at 120° C. for 2 hours, and the cured film was visually observed. The plating resistance was evaluated based on the following criteria.

AA: The cured film did not change color, and the plating solution did not intrude under the cured film;
BB: The plating solution intruded under the cured film, but the cured film did not change color.
CC: The cured film changed color, or the plating solution intruded under the cured film.

[Soldering Heat Resistance]

The solder resist ink was applied on a substrate by screen printing through a No. 100-mesh polyester plate in accordance with the testing method of JIS C 6481. The ink was dried at 80° C. for 30 minutes, and cured at 150° C. for 1 hour. The substrate used was a printed board (UPICEL® N manufactured by UBE INDUSTRIES, LTD.) consisting of a polyimide film (50 μm thick) and a copper foil (35 μm thick) on one surface of the polyimide film. This substrate had been washed with a 1% aqueous sulfuric acid solution, rinsed with water and air dried. The substrate with the heat-cured solder resist ink was floated in a 260° C. solder bath for 10 seconds, and the cured film was visually observed. The soldering heat resistance was evaluated based on the following criteria.

AA: The cured film did not swell, and the solder did not intrude under the cured film.
CC: The cured film swelled, or the solder intruded under the cured film.

[Long-Term Reliability]

Flexible copper-clad laminate (UPICEL® N BE1310 manufactured by UBE INDUSTRIES, LTD.) was etched with No. 200-mesh stainless steel screen to a comb-shaped board (the width of the copper wiring/the pitch of the copper wirings=50 μm/50 μm). The solder resist ink was applied on the board by screen printing through a No. 100-mesh polyester plate. The ink was dried at 80° C. for 30 minutes, and cured at 150° C. for 1 hour. The substrate was exposed to 85° C. and 85% RH, and a bias voltage of 100 V was applied to the substrate for 500 hours. The electrical insulating properties were evaluated based on the following criteria.

AA: No migration and no decrease in insulation resistance resulted.
BB: Migration or decreased insulation resistance resulted after 200-500 hours.
CC: Migration or decreased insulation resistance resulted within 200 hours.

TABLE 1

Properties of cured films

| | Ex. 1 | Ex. 2 | Ex. 3 | Ex. 4 | Ex. 5 | Ex. 6 | Ex. 7 | Ex. 14 | Comp. Ex. 1 | Comp. Ex. 2 | Comp. Ex. 3 | Comp. Ex. 4 | Comp. Ex. 5 |
|---|---|---|---|---|---|---|---|---|---|---|---|---|---|
| Adhesion | 0 | 0 | 0 | 0 | 0 | 0 | 0 | 0 | 0 | 0 | 0 | 0 | 0 |
| Warpage | AA | AA | AA | AA | AA | AA | AA | AA | AA | CC | AA | CC | AA |
| Flexibility | AA | AA | AA | AA | AA | AA | AA | AA | AA | CC | AA | AA | AA |
| Plating resistance (tin plating) | BB | BB | BB | BB | BB | BB | BB | AA | CC | AA | CC | CC | CC |
| Soldering heat resistance | AA | AA | AA | AA | AA | AA | AA | AA | CC | AA | AA | AA | CC |
| Long-term reliability | AA | AA | AA | AA | AA | AA | AA | AA | BB | BB | CC | CC | BB |

INDUSTRIAL APPLICABILITY

The carboxyl group-containing polyurethane has superior properties as a material of solder resist inks capable of giving cured products excellent in adhesion with substrates, low warpage, flexibility, plating resistance, soldering heat resistance and long-term reliability at high temperatures and high humidities. The carboxyl group-containing polyurethane of the present invention can find uses in the fields such as heat-curable resins with superior flexibility for overcoating flexible circuits, electrical insulating materials such as heat-curable solder resists and interlayer insulation materials with superior insulating properties, IC and SLSI encapsulating materials, and laminates.

The carboxyl group-containing polyurethane and the solution of carboxyl group-containing polyurethane can produce resist inks more inexpensively than the conventional liquid polyimide inks. Protective films from the conventional resist inks suffer warpage due to large cure shrinkage and post-curing cooling shrinkage, and consequently the yield is low. The resist ink according to the present invention enables inexpensive and efficient production of protective films that can achieve a tradeoff between the low warpage and long-term insulating reliability at high temperatures and high humidities, as well as excellent plating resistance and soldering heat resistance.

The invention claimed is:

1. An overcoat ink for overcoating flexible circuits comprising a carboxyl group-containing polyurethane produced by reacting:
    (A) a polyisocyanate compound;
    (B) a polycarbonate diol having:
        (i) a number-average molecular weight of 500 to 50,000;
        (ii) an alkylene group of 8 to 18 carbon atoms in its structure; and
        (iii) hydroxyl groups at both ends;
    (C) a carboxyl group-containing dihydroxy compound;
    (D) an optional monohydroxy compound; and
    (E) an optional monoisocyanate compound;
    and an organic solvent,
    wherein the polyisocyanate compound (A) contains at least 10 mol % relative to the total (100 mol %) thereof of an aromatic and/or an alicyclic compound of 6 to 30 carbon atoms except the carbon atom in the isocyanate group (NCO group).

2. A cured product produced by curing the overcoat ink of claim 1.

3. The cured product according to claim 2, wherein the curing involves an epoxy resin.

4. The overcoat ink according to claim 1, wherein the polycarbonate diol (B) is produced from a raw material diol including at least 30 mol % of a diol having 8 to 18 carbon atoms.

5. The overcoat ink according to claim 1, wherein at least part of the alkylene groups constituting the structure of the polycarbonate diol (B) is an alkylene group of 9 carbon atoms.

6. The overcoat ink according to claim 5, wherein the alkylene group of 9 carbon atoms is represented by —$CH_2$—$CH(CH_3)$—$(CH_2)_6$— and/or —$(CH_2)_9$—.

7. The overcoat ink according to claim 1, wherein the dihydroxy compound (C) is 2,2-dimethylolpropionic acid and/or 2,2-dimethylolbutanoic acid.

8. The overcoat ink according to claim 1, wherein the monohydroxy compound (D) is one or a combination of two or more monohydroxy compounds selected from the group consisting of 2-hydroxyethyl acrylate, 2-hydroxyethyl methacrylate, allyl alcohol, glycolic acid and hydroxypivalic acid.

9. The overcoat ink according to claim 1, wherein the monohydroxy compound (D) is one or a combination of two or more monohydroxy compounds selected from the group consisting of methanol, ethanol, n-propanol, isopropanol, n-butanol, isobutanol, sec-butanol and t-butanol.

10. The overcoat ink according to claim 1, wherein the polyurethane has a number-average molecular weight of 1,000 to 100,000 and an acid value of 5 to 120 mgKOH/g.

11. The overcoat ink according to claim 1, wherein the polyurethane has a number-average molecular weight of 3,000 to 50,000 and an acid value of 10 to 70 mgKOH/g.

12. The overcoat ink according to claim 1, wherein the organic solvent is a solvent that is free of basic compounds and has a boiling point of not less than 120° C.

13. The solution of carboxyl group-containing polyurethane according to claim 12, wherein the solvent is one or a combination of two or more solvents selected from the group consisting of xylene, ethylbenzene, nitrobenzene, isophorone, diethylene glycol dimethyl ether, ethylene glycol diethyl ether, ethylene glycol methyl ether acetate, ethylene glycol ethyl ether acetate, propylene glycol methyl ether acetate, propylene glycol ethyl ether acetate, dipropylene glycol methyl ether acetate, dipropylene glycol ethyl ether acetate, diethylene glycol ethyl ether acetate, diethylene glycol methyl ether acetate, methyl methoxypropionate, ethyl methoxypropionate, methyl ethoxypropionate, ethyl ethoxypropionate, n-butyl acetate, isoamyl acetate, ethyl lactate, cyclohexanone, γ-butyrolactone and dimethylsulfoxide.

14. The overcoat ink according to claim 13, wherein the solvent is one or a combination of two or more solvents selected from the group consisting of propylene glycol methyl ether acetate, propylene glycol ethyl ether acetate, dipropylene glycol methyl ether acetate, diethylene glycol ethyl ether acetate and γ-butyrolactone.

* * * * *